(12) United States Patent
Pavlicek et al.

(10) Patent No.: US 11,749,633 B2
(45) Date of Patent: Sep. 5, 2023

(54) POWER SEMICONDUCTOR MODULE WITH LASER-WELDED LEADFRAME

(71) Applicant: Hitachi Energy Switzerland AG, Baden (CH)

(72) Inventors: Niko Pavlicek, Zürich (CH); Fabian Mohn, Ennetbaden (CH); Markus Thut, Nidau (CH); Swen Koenig, Küssaberg (DE)

(73) Assignee: Hitachi Energy Switzerland AG, Baden (CH)

( * ) Notice: Subject to any disclaimer, the term of this patent is extended or adjusted under 35 U.S.C. 154(b) by 149 days.

(21) Appl. No.: 17/604,717

(22) PCT Filed: Mar. 12, 2020

(86) PCT No.: PCT/EP2020/056641
§ 371 (c)(1),
(2) Date: Oct. 18, 2021

(87) PCT Pub. No.: WO2020/212031
PCT Pub. Date: Oct. 22, 2020

(65) Prior Publication Data
US 2022/0406745 A1 Dec. 22, 2022

(30) Foreign Application Priority Data
Apr. 18, 2019 (EP) .................................... 19170007

(51) Int. Cl.
*H01L 23/00* (2006.01)
*H01L 23/498* (2006.01)
*H01L 25/07* (2006.01)

(52) U.S. Cl.
CPC .......... *H01L 24/40* (2013.01); *H01L 23/4985* (2013.01); *H01L 24/37* (2013.01); *H01L 24/73* (2013.01); *H01L 24/84* (2013.01); *H01L 25/072* (2013.01); *H01L 2224/37147* (2013.01); *H01L 2224/4001* (2013.01); *H01L 2224/4005* (2013.01); *H01L 2224/40137* (2013.01);
(Continued)

(58) Field of Classification Search
CPC ....................................................... H01L 24/40
USPC ....................................................... 257/737
See application file for complete search history.

(56) References Cited

U.S. PATENT DOCUMENTS 9,240,370 B1 1/2016 Yang et al.
9,620,440 B1 4/2017 Shibuya
(Continued)

FOREIGN PATENT DOCUMENTS

DE  102012222791 A1  6/2014
EP  1811557 A2  7/2007
(Continued)

*Primary Examiner* — Ajay Arora
(74) *Attorney, Agent, or Firm* — Slater Matsil, LLP

(57) ABSTRACT

A power semiconductor module includes a substrate with a structured metallization layer and a number of semiconductor chips. Each chip has a first power electrode bonded to the metallization layer. A leadframe is laser-welded to second power electrodes of the semiconductor chips for electrically interconnecting the semiconductor chips. A control conductor is attached to the leadframe opposite to the semiconductor chips and is electrically isolated from the leadframe. The control conductor is electrically connected to control electrodes of the semiconductor chips in the group.

22 Claims, 4 Drawing Sheets

(52) U.S. Cl.
CPC ........... *H01L 2224/48225* (2013.01); *H01L 2224/48245* (2013.01); *H01L 2224/73221* (2013.01); *H01L 2224/84214* (2013.01); *H01L 2924/1203* (2013.01); *H01L 2924/13055* (2013.01); *H01L 2924/13091* (2013.01); *H01L 2924/3512* (2013.01); *H01L 2924/386* (2013.01)

(56) References Cited

U.S. PATENT DOCUMENTS

| | | | |
|---|---|---|---|
| 2008/0272472 A1* | 11/2008 | Hata | H01L 24/11 257/E23.044 |
| 2009/0057853 A1 | 3/2009 | Gerbsch et al. | |
| 2010/0065950 A1 | 3/2010 | Lowry et al. | |
| 2014/0217600 A1 | 8/2014 | Yamaguchi | |
| 2017/0092596 A1 | 3/2017 | Yoshihara | |
| 2018/0090338 A1 | 3/2018 | Yoshihara et al. | |
| 2019/0333866 A1* | 10/2019 | Tsukuda | H01L 23/49524 |
| 2020/0273838 A1* | 8/2020 | Williams | H01L 23/49582 |
| 2020/0343106 A1* | 10/2020 | Usui | H01L 21/185 |

FOREIGN PATENT DOCUMENTS

| | | |
|---|---|---|
| EP | 3026701 A1 | 6/2016 |
| EP | 3104507 A1 | 12/2016 |
| JP | 2013105789 A | 5/2013 |
| JP | 2018116960 A | 7/2018 |
| WO | 2018096050 A1 | 5/2018 |

* cited by examiner

POWER SEMICONDUCTOR MODULE WITH LASER-WELDED LEADFRAME

CROSS-REFERENCE TO RELATED APPLICATIONS

This application is a national stage application of International Application No. PCT/EP2020/056641, filed on Mar. 12, 2020, which claims priority to European Patent Application No. 19170007.9, filed on Apr. 18, 2019, which applications are hereby incorporated herein by reference.

TECHNICAL FIELD

The invention relates to a power semiconductor module.

BACKGROUND

Semiconductor chips (such as IGBTs, MOSFETs, diodes, etc.) typically used in power semiconductor modules are vertical devices. The current flows vertically from the top-side source/emitter contact to the bottom-side drain/collector contact. The full area of the bottom-side of the chip is bonded (for example soldered or sintered) to a metallic layer (for example the top-metallization layer of a ceramic substrate). The top-side connection is usually realized by a multitude of thick wire bonds.

Recent developments focus on replacing Si devices by wide-band gap devices made from SiC or GaN because of beneficial properties in terms of minimizing switching losses and/or increasing switching frequencies. In addition, the current densities increase and less chip area is available to accommodate the required number of wire bonds for a given current.

Wire bonding technology may reach its limits with regards to current capability. This has already triggered a move from Al to Cu wires to ensure reliable bonds. Nevertheless, the increasing current densities of novel power semiconductor switches may require superior top-side connections.

Furthermore, a multitude of thick bond wires may limit the manufacturing throughput per wire bonder equipment and may lead to significant wear of the wire bonding tools. Also, the reliability of power semiconductor modules with a multitude of wire bonds may be limited, because wire bond failures (such as lift-off, heel cracks, etc.) belong to the dominant failure mechanisms.

US 2018 090 338 A1 describes a power semiconductor module with a leadframe welded to a stress buffering layer bonded to a chip.

US 2014/217 600 A1 relates to manufacturing of a semiconductor module, which has several semiconductor chips, which are bonded to a heating body.

DE 10 2012 222 791 A1 shows a semiconductor module having a contact element, which is laser-welded via a sinter layer to a power semiconductor chip.

JP 2013 105 789 A shows a semiconductor module with an electric contact element, which is bonded to two semiconductor chips and to which a flexible circuit board is attached.

SUMMARY

Embodiments of the invention provide a reliable and easy and fast to manufacture power semiconductor module with a high current density.

According to a first embodiment, a power semiconductor module comprises a substrate with a structured metallization layer. Semiconductor chips are bonded with first power electrodes to the metallization layer. A leadframe, which is laser-welded to second electrodes of a group of the semiconductor chips, is used for electrically interconnecting the semiconductor chips. A control conductor is attached to the leadframe opposite to the semiconductor chips and is electrically isolated from the leadframe. The control conductor is electrically connected to control electrodes of the semiconductor chips in the group and the control conductor is laser-welded to at least one of the control electrodes.

BRIEF DESCRIPTION OF THE DRAWINGS

The subject-matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

Figure 1:
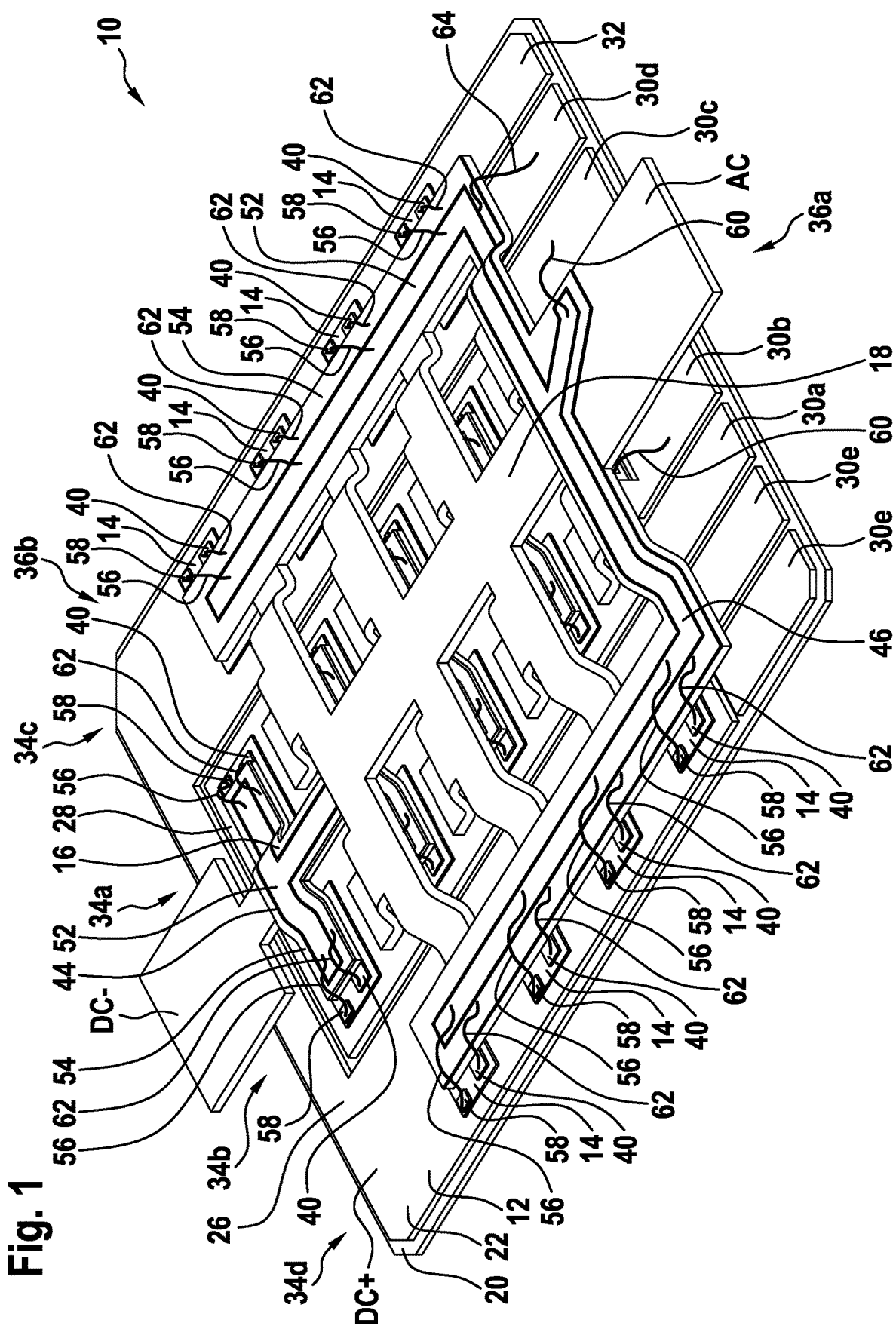
FIG. 1 shows a perspective view of a power semiconductor module.

10 power semiconductor module
    12 substrate
    14 semiconductor chip
    16 first leadframe
    18 second leadframe
    20 insulating layer
    22 metallization layer
    24 metallization layer
    26 DC+ area
    28 AC area
    30, 30' terminal area
    30a low side auxiliary source area
    30b low side gate area
    30c high side auxiliary source area
    30d high side gate area
    30e temperature sensor area
    32 high side auxiliary drain part
    34a first row
    34b second row
    34c third row
    34d fourth row
    36a first group
    36b second group
    38 first power electrode
    40 second power electrode
    42, 42' buffer plate
    44 first flexible circuit board
    46 second flexible circuit board
    48 insulation base layer
    50 electrically conducting layer 52 gate/control conductor
54 auxiliary/source/control conductor
56 wire bond
58 control electrode
60 wire bond
62 wire bond
64 wire bond
66 central part
68, 68' power terminal
70 branching part
72 AC area connection
74 peripheral part
76, 76' first layer
78, 78' second layer
80 active electrode area
82 laser-weld
84 leadframe preform
86 bridge
88 housing
90 control substrate
92 electrically insulating layer
94 isolated cable or wire

DETAILED DESCRIPTION OF EXEMPLARY ILLUSTRATIVE EMBODIMENTS

The invention relates to a power semiconductor module. A power semiconductor module may be an assembly comprising power semiconductor chips, their electrical interconnections, terminals and a mechanical structure supporting all these components. A power semiconductor module may comprise a housing and terminal protruding from the housing. For example, the above-mentioned parts may be cased into a housing made from polymer material.

The term "power" here and in the following may be related to modules, chips and/or devices, which are adapted for processing a voltage of more than 100 V, for example more than 100 V and/or more than 1 A, for example more than 10 A.

The power semiconductor chips may be and/or may provide one or more semiconductor devices, such as transistors, thyristors and/or diodes, in particular IGBTs, IGCTs and/or MOSFETs. Some or all of the power semiconductor chips may be power semiconductor switches. The power semiconductor chips may be made from Si and/or from wide-band gap materials, such as SiC, GaN, etc.

According to an embodiment of the invention, the power semiconductor module comprises a substrate with a structured metallization layer and a plurality of semiconductor chips bonded with first power electrodes to the metallization layer. The substrate may comprise an isolating layer, for example made of ceramics, and the metallization layer, which may be made of metal, such as Cu. The metallization layer may be structured, i.e., divided into areas, which are electrically disconnected on the isolation layer (but which may be electrically connected via further conductors).

The semiconductor chips may be sintered and/or soldered to the metallization layer. The first power electrode, such as a drain, a source, a collector or an emitter, may cover the complete side of the semiconductor chip facing the metallization layer.

According to an embodiment of the invention, the power semiconductor module comprises a leadframe, which is laser-welded to second electrodes of a group of the semiconductor chips for electrically interconnecting the semiconductor chips. The leadframe may be a metal plate, for example made of Al, Cu, etc. and/or from sheet metal. The second power electrode, such as a drain, a source, a collector or an emitter, together with a control electrode, such as a gate, may cover the complete side of the semiconductor chip opposite to the metallization layer. The leadframe may solely cover the second power electrode. It may be laser-welded to the second power electrode with a laser beam that is direct towards the side of the leadframe facing away from the power semiconductor chip. The laser-weld seam may be circular, line-shaped and/or dot-shaped and/or a combination thereof.

The group of semiconductor chips may be parallel with their power electrodes via the metallization layer of the substrate and the leadframe.

It has to be noted that the power semiconductor module may comprise more than one laser-welded leadframe. The one or more leadframes may be used as top-side source and/or emitter connection. A single leadframe may connect all parallel semiconductor chips.

According to an embodiment of the invention, the power semiconductor module comprises a control conductor attached to the leadframe opposite to the semiconductor chips and electrically isolated from the leadframe, wherein the control conductor is electrically connected to control electrodes of the semiconductor chips in the group and the control conductor is laser-welded to at least one of the control electrodes. The control conductor may guide a control signal, such as a gate signal, to the power semiconductor chips. The control conductor may comprise one or more metallization layers and/or one or more wires, which are electrically isolated from the leadframe. For example, electrically isolated material is provided between the control conductor and the leadframe.

When the control conductor, for example in the form of a metal layer of a flexible circuit board or substrate, is guided above the control electrode, it may be laser-welded to the control electrode.

It has to be noted that the control conductor also may be used for routing other auxiliary signals, such as an auxiliary source connection and/or signals from a sensor. Signal connections in the form of one or more control conductors may be guided in additional layers on top of the leadframe.

The one or more leadframes may enable high reliability and low cost power modules. The one or more leadframes may be precisely placed on the semiconductor chips on a power module substrate and welded by means of a focused laser beam. Leadframe based top-side connections may replace a multitude of thick wire bonds. Such leadframes may also act directly as power terminals.

Furthermore, since the substrate area may be reduced, the footprint of the fully assembled power semiconductor module (including a mold encapsulation or housing) in turn may reduce roughly by half its size. Additionally, this may lead to cost savings of mold compound or housing.

The number of manufacturing steps may be reduced, since, for example, bonding of top substrates to the main substrate, subsequent cleaning steps, and at least some terminal bonds may be omitted. The reliability of the power semiconductor module may increase, because the dominant failure source of wire bonds may be mitigated. In the end, there may be an additional design freedom and/or improved electrical characteristics enabled by multilayer coplanar current routing, for example by stacked leadframes.

According to an embodiment of the invention, the power semiconductor module further comprises a flexible circuit board attached to the leadframe, wherein the control conductor is at least partially provided by a metal layer of the flexible circuit board. A flexible circuit board may comprise a flexible isolating layer and a metal layer. The flexible and/or preformed circuit may be bonded, such as laminated, glued, welded, etc. to the leadframe. It may be either fully bonded or on discrete spots to the leadframe. The at least one metal layer may provide conductive tracks, which may be used as one or more control conductors.

According to an embodiment of the invention, the power semiconductor module further comprises an electrically insulated wire attached to the leadframe, wherein the control conductor is at least partially provided by a metal core of the electrically insulated wire. Additionally or alternatively to the flexible circuit board, one or more insulated wires may be attached (such as glued) to the leadframe. The one or more insulating wires may have a coaxial design, i.e., may have an electrically conduction hose within the isolating for shielding a central wire for routing the control signals.

According to an embodiment of the invention, the power semiconductor module further comprises a control substrate with an electrically insulating layer attached to the leadframe, wherein the control conductor is at least partially provided by a metallization layer of the control substrate. Additionally or alternatively to the flexible circuit board and/or one or more insulated wires, a control substrate may be bonded (such as glued soldered, etc.) to the leadframe. The control substrate may be a ceramic substrate (such as direct bonded copper, DBC and/or active metal bracing, AMB) and/or an insulated metal substrate, IMS.

According to an embodiment of the invention, the control conductor is connected via a wire bond with at least one of the control electrodes. One or more wire bonds may be used. The wire bond may compensate different levels of the top side of the gate electrode and the control conductor above the leadframe.

According to an embodiment of the invention, the control conductor is part of a control substrate or a flexible circuit board, which protrudes over the leadframe at at least one of the control electrodes. It may be that the control conductor is guided above the control electrode, such that it can be directly connected to the control electrode.

According to an embodiment of the invention, the control conductor may electrically be connected with a through-via with at least one of the control electrodes. The control conductor may be bonded, such as soldered or sintered, to the control electrode.

According to an embodiment of the invention, a gate conductor and an auxiliary conductor are attached to the leadframe opposite to the semiconductor chips and electrically isolated from the leadframe. Two control conductors in the form of a gate conductor and an auxiliary conductor may be provided on the leadframe. The auxiliary conductor may be an auxiliary source connection.

According to an embodiment of the invention, two strips of the auxiliary conductor are provided on two sides of the gate conductor. In such a way, a coaxial arrangement of the gate conductor and the auxiliary conductor may be achieved to minimize a gate loop inductance.

According to an embodiment of the invention, the second power electrode of the semiconductor chips, to which the leadframe is laser-welded, comprises a metallic buffer plate bonded to the semiconductor chip. The buffer plate may be made of Cu or other weldable metals. The buffer plate may be bonded, such as soldered or sintered, to an active area of the semiconductor chip. The leadframe may be laser-welded to the buffer plate.

The buffer plate may facilitate laser-welding without damaging the active area of the semiconductor chip, because the active area metallization of the semiconductor chip may be too thin to accommodate a stable laser-weld. In general, one or multiple conducting buffer plates may be bonded onto the chip top side to enable laser-welding on the source pad or emitter pad.

Also the control electrode may comprise such a metallic buffer plate. A wire bond may be attached to the buffer plate. The control conductor may be laser-welded to the buffer plate.

According to an embodiment of the invention, the metallic buffer plate comprises two layers of different metal materials, such as Mo and Cu. A stack of multiple buffer plates of different materials may be used, such as a Mo plate on the semiconductor chip and a Cu plate on top of the Mo plate to provide a weldable surface.

According to an embodiment of the invention, the leadframe provides a power terminal of the power semiconductor module, which protrudes from a housing of the power semiconductor module. It may be that parts of the leadframe are used as external terminals. The housing may be a mold encapsulation and a part of the leadframe may protrude from the mold encapsulation.

According to an embodiment of the invention, a control terminal protrudes from the housing at the same level as the leadframe. The control terminal is made of the same material and with the same thickness as the leadframe. The control terminal may be made from the same leadframe preform as the leadframe interconnecting the semiconductor chips. The control terminal and the leadframe may be interconnected during manufacturing outside of the housing, wherein the interconnection is removed after providing the housing.

According to an embodiment of the invention, the control terminal is electrically interconnected with the control conductor inside the housing. This may be done with a wire bond and/or via laser-welding the control conductor to the control terminal.

In general, one or more additional terminals may be linked to the leadframe, wherein the links are removed, such as cut and/or trimmed, in a later production step.

According to an embodiment of the invention, the semiconductor chips are arranged in at least one row, wherein the leadframe comprises a central part running along the row and branching parts, which protrude from the center part over the semiconductor chips of the row. Semiconductor chips connected in parallel, which may form a single switch of the power semiconductor module, may be arranged in one or more rows. The leadframe may comprise a longitudinal, center part which may run between the rows of semiconductor chips to be connected. Each branching part may run from the center part to a position above a respective semiconductor chip. In general, the leadframe may be tree-shaped.

The control conductor may be provided on the central part and the branching parts and/or also may be tree-shaped.

According to an embodiment of the invention, the branching parts are bent towards the semiconductor chips. The central part of the leadframe may be on a higher level as the ends of the branching parts. The central part may be more distant to the substrate as the ends of the branching parts.

According to an embodiment of the invention, the leadframe comprises a peripheral part, which is attached to ends of the branching parts and which runs parallel to the central part. Such a leadframe may interconnect rows of semiconductor chips, which are more remote to each other as in the case of a tree-shaped leadframe. Such a leadframe may be seen to have a grid-shaped form. The peripheral parts may guide the current coaxial to the center part towards a terminal. In this case, the control conductor may be provided on the peripheral part. The central part may be more distant to the substrate as the peripheral parts.

According to an embodiment of the invention, the power semiconductor module forms a half-bridge and a first group of semiconductor chips are electrically connected in parallel with their power electrodes to form a low-side switch and a second group of semiconductor switches are electrically connected in parallel with their power electrodes to form a high-side switch. Each of the first group and the second group may be provided in two rows of semiconductor chips, which may be interconnected with a tree-shaped leadframe and/or a grid-shaped leadframe.

A first leadframe may be laser-welded to second electrodes of the first group of semiconductor chips and a second leadframe may be laser-welded to second electrodes of the second group of semiconductor chips.

According to an embodiment of the invention, the semiconductor chips of the first group are arranged in rows along a center line of the power semiconductor module and the semiconductor chips of the second group are arranged in two rows outside of the first group at two sides of the first group. The first leadframe, which may be tree-shaped, may be arranged between the substrate of the power semiconductor module and the second leadframe, which may be grid-shaped.

These and other aspects of the invention will be apparent from and elucidated with reference to the embodiments described hereinafter with respect to the figures.

FIG. 1 shows a perspective view of a power semiconductor module 10, which comprises a substrate 12, semiconductor chips 14 bonded to the substrate 12 and two leadframes 16, 18, which electrically interconnect the semiconductor chips 14 on their top side.

Figure 2:
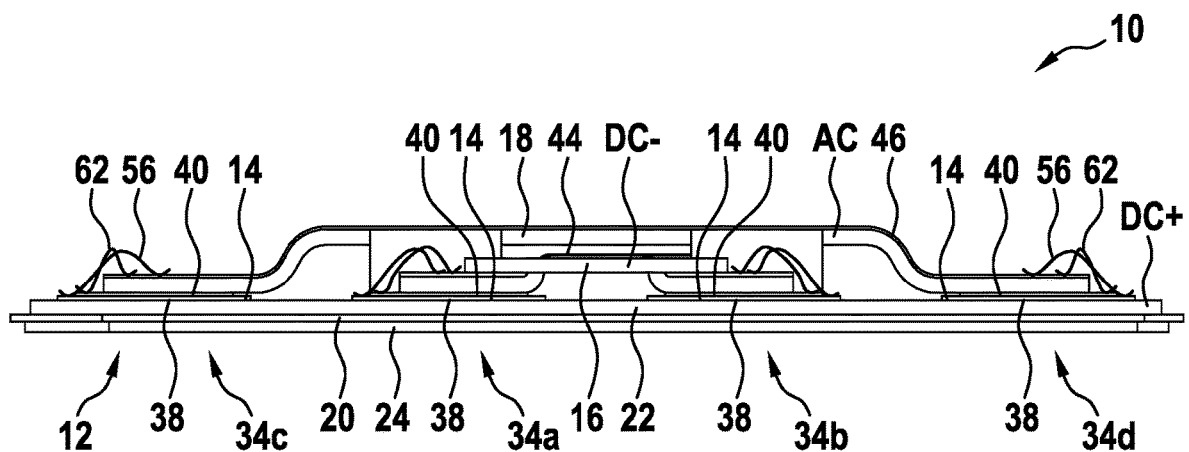
FIG. 2 shows a side view of the power semiconductor module of FIG. 1.
Figure 3:
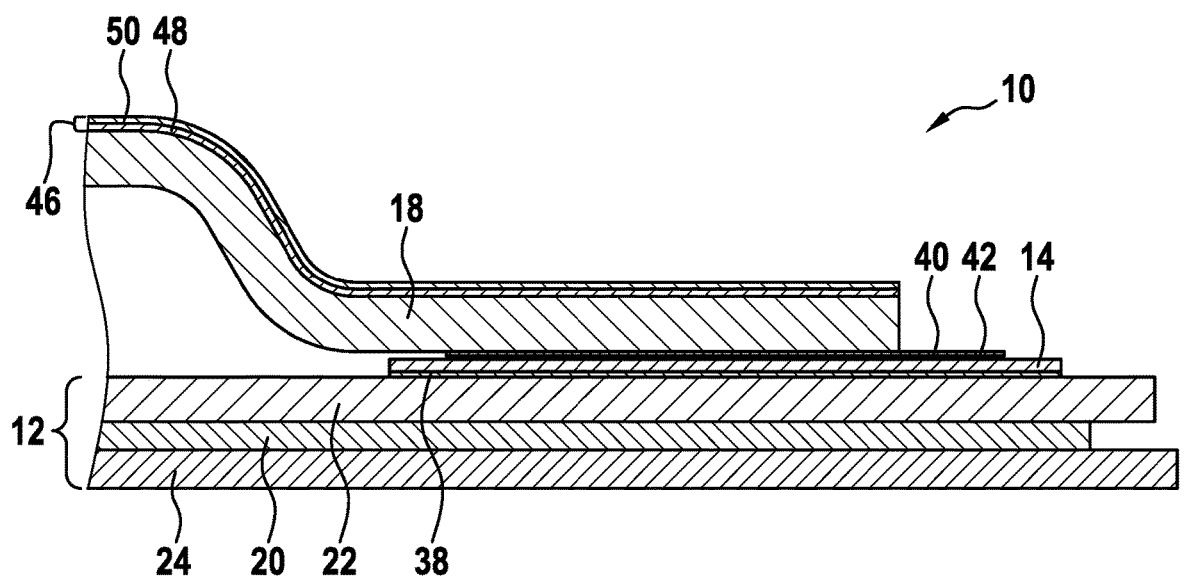
FIG. 3 shows a cross-sectional view of the power semiconductor module of FIG. 1.

The semiconductor module is also shown in FIGS. 2 and 3 in a side view and a cross-section view. There it is visible that the substrate 12 comprises an insulating layer 20 and two metallization layers 22, 24 on both sides of the insulating layer 20. The insulating layer 20 may be made of ceramics. The metallization layers 22, 24 may be made of Cu.

As shown in FIG. 1, the metallization layer 22 on the top side, i.e., the side facing the semiconductor chips 14, is structured, i.e., divided into several disconnected areas 26, 28, 30. The area 26 is a DC+ area and the area 28 is an AC area. The areas 3a, 3b, 3c, 3d may be used as auxiliary source, low side gate, high side auxiliary source and high side gate. The part 32 of area 26 may be used as high side auxiliary drain. The areas 3e may be used as terminals for a temperature sensor.

The semiconductor chips 14 are bonded to the respective areas 26, 28 of the metallization layer 22 and are connected via the leadframes 16, 18 to form a half-bridge. The semiconductor chips 14 are arranged in four parallel rows 34a, 34b, 34c, 34d. The rows 34a, 34b form a first group 36a of parallel connected semiconductor chips 14, which provide a low side switch of the half-bridge. The rows 34c, 34d form a first group 36a of parallel connected semiconductor chips 14, which provide a high side switch of the half-bridge.

The semiconductor chips 14 provide a first power electrode 38 on their bottom side and a second power electrode 40 on their top side.

The bottom side power electrodes 38 of the chips 14 of the rows 34c, 34d are connected to the DC+ area 26, which during operation of the module 10 is on DC+ potential. The top side power electrodes 40 of the chips 14 of the rows 34c, 34d are connected to the leadframe 18, which is also connected to the AC area 28. The leadframe 18 and the AC area 28 are on AC potential during operation of the module 10. The bottom side power electrodes 38 of the chips 14 of the rows 34a, 34b are connected to the AC area 28. The top side power electrodes 40 of the chips 14 of the rows 34a, 34a are connected to the leadframe 16, which is on DC-potential during operation of the module 10.

The leadframes 16, 18, which may be made of sheet metal and/or of Cu, are laser-welded to the top side electrodes 40. As shown in FIG. 3, the top side electrode 40 may comprise a buffer plate 42, which is bonded to an active area of the semiconductor chip 14. The leadframe 16, 18 then may be welded to the buffer plate 42, which may be made of a metal, such as Cu and/or Mo.

As shown in FIG. 1, a flexible circuit board 44, 46 is attached to a top side of each of the leadframes 16, 18. Each of the flexible circuit boards 44, 46 comprises an insulation base layer 48, which is attached to the respective leadframe 16, 18 and an electrically conducting layer 50 on top of the base layer 48 (see FIG. 3). The base layer 48 may be made of a flexible plastics material and/or foil. The electrically conducting layer 50, which may be made of Cu, is divided into disconnected areas, each of which provides a control conductor 52, 54 for the module 10.

Figure 4:
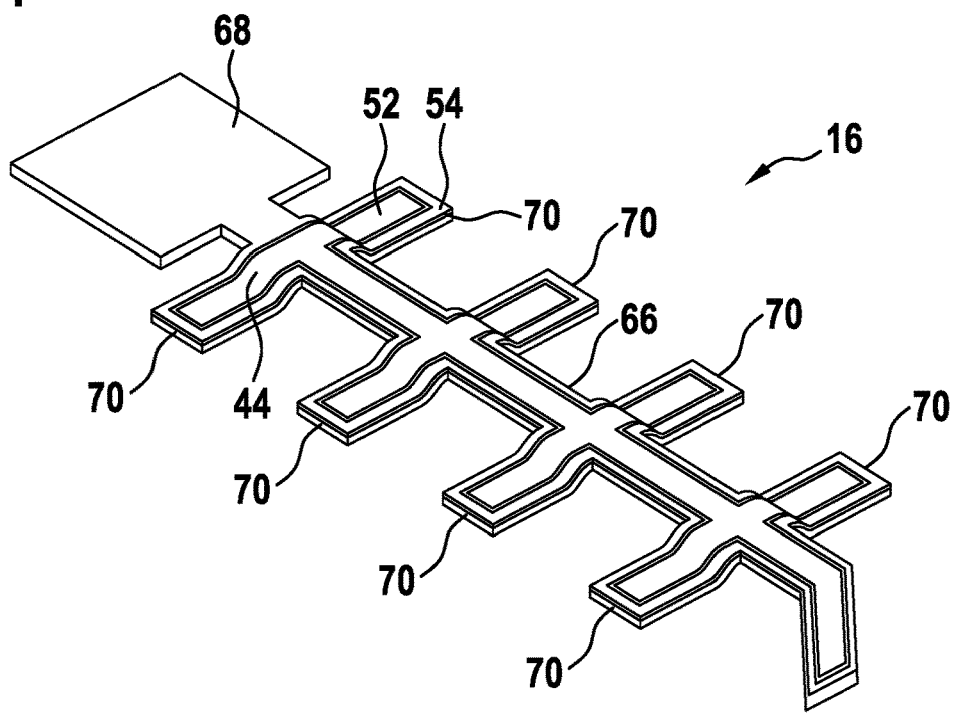
FIG. 4 shows a tree-shaped leadframe of the power semiconductor module of FIG. 1.
Figure 5:
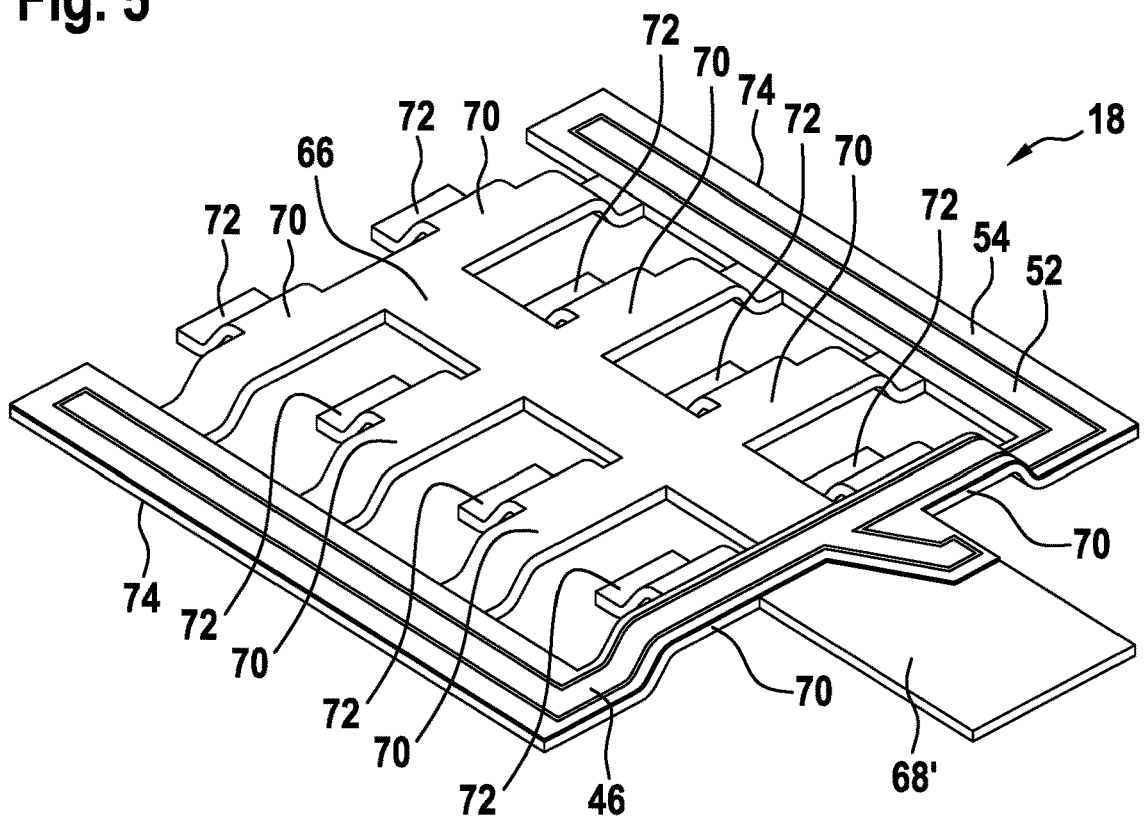
FIG. 5 shows a grid-shaped leadframe of the power semiconductor module of FIG. 1.

Also as shown in FIGS. 4 and 5, an inner area 52 of the layer 50 provides the gate conductor 52. The inner area/gate conductor 52 is used for gate signal distribution. An outer area 54, which surrounds the inner area 52, provides a conductor 54 for an auxiliary source potential. To minimize the gate loop inductance, the inner area 52 is guided between two traces and/or strips of the outer area 54. It also may be that only one area, such as the area 52 or the area 54 is present for conducting a control signal.

Returning to FIG. 1, the gate conductor 52 may be connected via a wire bond 56 with the respective control electrode 58 of the respective power semiconductor chip 14. A further wire bond 60 may be used to connect the gate conductor 52 to the terminal area 3c, 3b, respectively.

The auxiliary conductor 54 may be connected via a wire bond 62 with the power electrode 40 of the respective power semiconductor chip 14. A further wire bond 64 may be used to connect the auxiliary conductor 54 to the terminal area 3d, 3a, respectively.

The dimensions of the gate conductor 52 and/or the auxiliary conductor 54 may be adapted depending on the requirements, for example whether per-chip gate resistors are required. The area of the leadframe 16, 18 to be laser-welded to the power semiconductor chips 14 may be left free of the flexible circuit board 44, 46.

FIG. 4 shows the tree-shaped leadframe 16 in more detail. The leadframe 16 has a longitudinal central part 66, which runs along a center of the module 10, between the two inner rows 34a, 34b of semiconductor chips 14. At one end, a power terminal 68 is connected to the central part 66, which power terminal is also made of the material of the leadframe 16. At the other end, the central part 66 is kinked, such that the flexible circuit board 44 on top of it is guided towards the terminal area 3b (see FIG. 1). The semiconductor module 10 may have a molded encapsulation and only a part of the terminal 68 may protrude from the encapsulation.

The leadframe 16 furthermore comprises branching parts 70, which branch off substantially orthogonally from the central part 66. Ends of the branching parts 70 are aligned above the power semiconductor chips 14 of the inner rows 34. Furthermore, the branching parts 70 are bent towards the semiconductor chips 14, such that the central part 66 is on a higher level as the ends of the branching parts 70.

The flexible circuit board 44 on the leadframe 16 runs along the central part and the branching parts 70 and also is tree-shaped.

FIG. 5 shows the grid-shaped leadframe 18 in more detail. As the leadframe 16, the leadframe 18 has a central part 66, a power terminal 68' and branching parts 70. When the leadframe 18 is in the module 10, the power terminal 68' is arranged on an opposite side of the module 10 with respect to the power terminal 68 of the leadframe 16.

The leadframe 18 also provides AC area connections 72, which are connected to the branching parts 70 and which are bent down towards the AC area 28. The leadframe 18 may be laser-welded to the AC area 28 via the AC area connections 72.

The leadframe 18 additionally has two longitudinal peripheral parts 74, which run parallel to the central part 66 and which are connected to the branching parts 70. The peripheral parts 74 are on a lower level as the central part 66. The peripheral parts 74 are positioned on top of the outer rows 34c, 34d of semiconductor chip 14. The leadframe 18 is welded via the peripheral parts 74 with the power semiconductor chips 14.

The flexible circuit board 46 on the leadframe 16 runs along the peripheral parts 74 and the branching parts 70 besides the power terminal 68'. The flexible circuit board 46 is U-shaped.

A power semiconductor module 10 may be manufactured as following.

In a first step, the semiconductor chips 14 may be bonded to the substrate 12. In this step, also the buffer plates 42 may be bonded to the semiconductor chips 14.

In a second step, the first leadframe 16 may be laser-welded to the first group 36a of semiconductor chips in the rows 34a, 34b. After that, the gate conductor 52 may be wire-bonded to the respective gate/control electrodes 58. Also, the auxiliary source conductor 54 may be wire-bonded to the respective second electrodes 40.

In a third step, the second leadframe 18 may be laser-welded to the second group 36b of semiconductor chips in the rows 34c, 34d. The first leadframe 16 is then sandwiched between the substrate 12 and the second leadframe 18. The gate conductor 52 of the second leadframe 18 may be wire-bonded to the respective gate/control electrodes 58. Also, the auxiliary source conductor 54 of the second leadframe 18 may be wire-bonded to the respective second electrodes 40.

Depending on the specific layout of the leadframes 16, 18, alternative manufacturing sequences may be possible. For example, it may be possible to merge both laser bonding steps and both wire bonding steps, respectively, when the second leadframe 18 is designed such that the top sides of the first group 36a of semiconductor chips 14 remain accessible.

Figure 6:
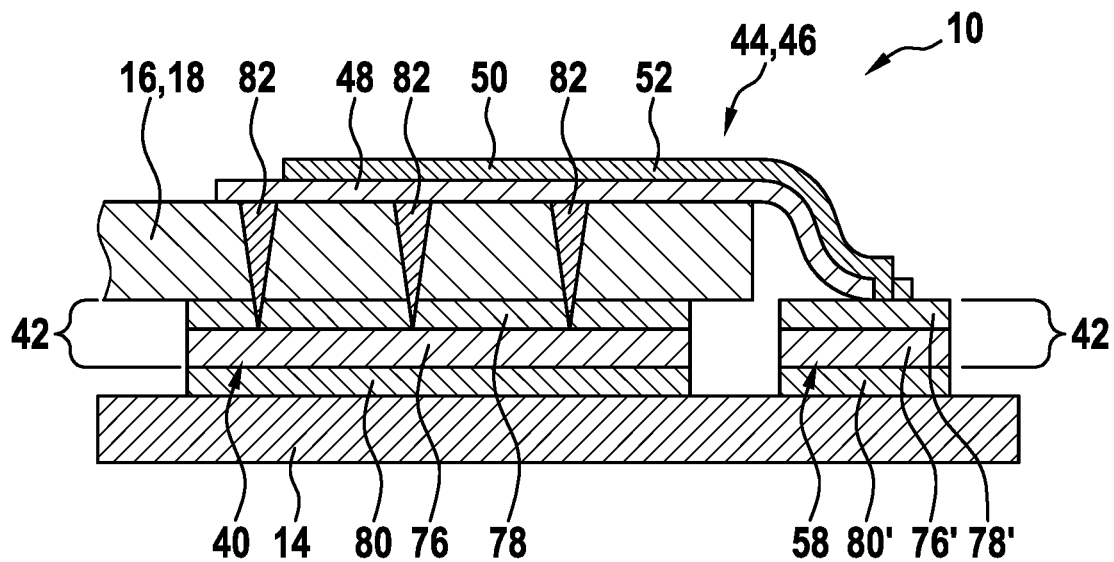
FIG. 6 shows a partial cross-sectional of a power semiconductor module according to an embodiment of the invention.

FIG. 6 shows a partial cross-sectional of a power semiconductor module 10, in which the buffer plate 42 has more than one layer 76, 78. The layers 76, 78 may be metal layers of different material, such as Mo and Cu.

The power semiconductor chip 14 may comprise an active electrode area 80 on the semiconductor substrate, to which the first layer 76, such as a Mo layer is bonded (for example soldered or sintered). The second layer 78, such as a Cu layer, is bonded to the first layer 76 and/or the leadframe 16, 18 is laser-welded to the second layer 78. FIG. 6 shows laser-welds 82 running through the leadframe 16, 18 and the second layer 78. It may be that the laser-welds 82 stop before the first layer 76.

FIG. 6 shows a further embodiment, how the flexible circuit board 44, 46 may be electrically connected to the semiconductor chip 14. The flexible circuit board 44, 46 protrudes and/or extends of an edge of the leadframe 16, 16. The flexible circuit board 44, 46 may lie on the gate/control electrode 58 and the gate/control conductor 52 may be directly bonded to the gate/control electrode 58, for example via welding, laser-welding, soldering, etc. It may be that the flexible circuit board 44, 46 has a through-via between the gate/control conductor 52 and the gate/control electrode 58.

It has to be noted that also the electrical connection of the auxiliary conductor 54 to the electrode 40 may be made in this way.

It may be that a further buffer plate 42' is bonded to an active area 80' of the gate/control electrode 58, which buffer plate 42' also may have two layers 76', 78', which may be made as the ones of the buffer plate 42.

Figure 7:
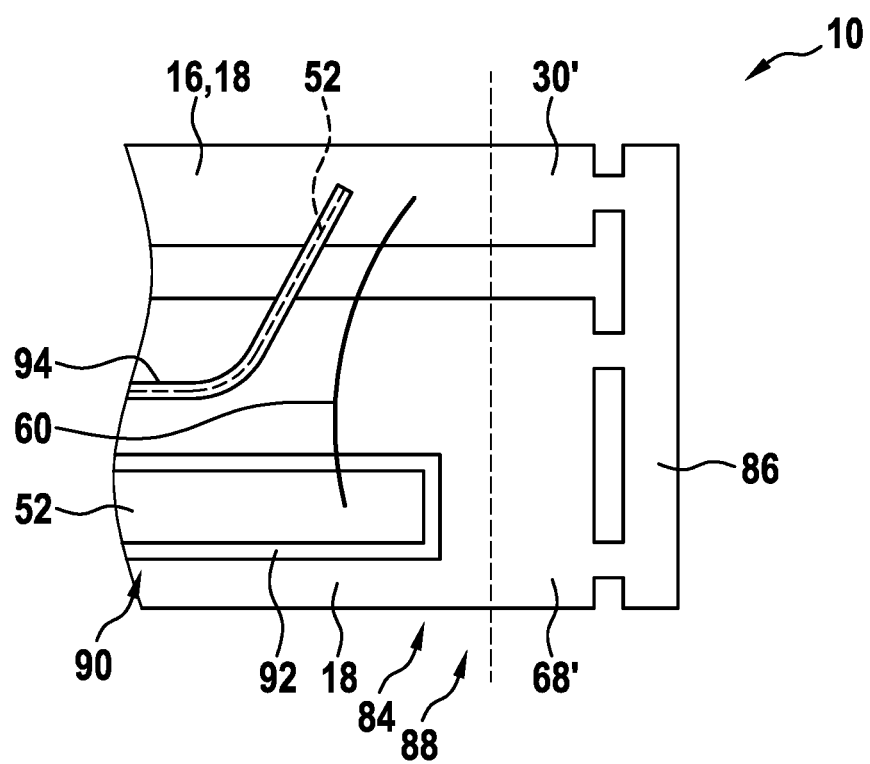
FIG. 7 shows a partial top view of a power semiconductor module.

FIG. 7 shows a partial top view of a power semiconductor module 10, where several terminals 68', 30' are made from the same leadframe preform 84. The leadframe 18 may be connected via a bridge 86 with the terminal 30', which may be a gate terminal. After attachment to the module 10 the leadframe 18 and the terminal 30' may be disconnected by removing the bridge 86. In particular, the module 10 may comprise a molded housing 88, which is indicated by the dashed line. The leadframe 18 and the terminal 30' may be partially molded into the housing 88, which may be a mold encapsulation.

The same concept may be applied to other types of terminals, to the leadframe 16 in combination with other types of terminal and/or to both leadframes 16, 18, i.e., the leadframes 16, 18 may be combined in one preform 84, may be attached to the module 10 together and may be disconnected by removing the bridge 86 after molding the housing.

FIG. 7 furthermore shows that the control conductor 52 may be provided by a control substrate 90 with an electrically insulating layer 92 attached to the leadframe 18. The control conductor 52 may be provided by a metallization layer 50 on the control substrate 90, which may be a DBC, AMD or IMS substrate.

The control conductor 52 also may be provided by an isolated cable or wire 94, which may be attached and/or may run above the leadframe 18. This cable or wire 94 may be a coaxial cable.

It has to be noted that also the control conductor 54 may be provided as such an isolated cable or wire 94 and/or that the control conductor 54 may be provided as metallization layer 50 on a control substrate 90.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practicing the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

The invention claimed is:

1. A power semiconductor module, comprising:
a substrate with a structured metallization layer;
a plurality of semiconductor chips, each chip having a first power electrode bonded to the metallization layer;
a leadframe laser-welded to second power electrodes of a group of the semiconductor chips for electrically interconnecting the semiconductor chips; and
a control conductor attached to the leadframe opposite to the semiconductor chips and electrically isolated from the leadframe, wherein the control conductor is electrically connected to control electrodes of the semiconductor chips in the group, the control conductor being laser-welded to at least one of the control electrodes.

2. The power semiconductor module of claim 1, further comprising a flexible circuit board attached to the leadframe, wherein the control conductor is at least partially provided by a metal layer of the flexible circuit board.

3. The power semiconductor module of claim 1, further comprising an electrically insulated wire attached to the leadframe, wherein the control conductor is at least partially provided by a metal core of the electrically insulated wire.

4. The power semiconductor module of claim 1, further comprising a control substrate with an electrically insulating layer attached to the leadframe, wherein the control conductor is at least partially provided by a metallization layer of the control substrate.

5. The power semiconductor module of claim 1, wherein the control conductor is further connected via a wire bond to the at least one of the control electrodes.

6. The power semiconductor module of claim 1, wherein the first power electrode of each chip is wire bonded to the metallization layer.

7. The power semiconductor module of claim 1, wherein the control conductor is part of a control substrate or a flexible circuit board that protrudes over the leadframe at the control electrode of each semiconductor chip.

8. The power semiconductor module of claim 7, wherein the control conductor is electrically connected with a through-via with at least one of the control electrodes.

9. The power semiconductor module of claim 1,
wherein a gate conductor and an auxiliary conductor are attached to the leadframe opposite to the group of semiconductor chips and electrically isolated from the leadframe; and
wherein two strips of the auxiliary conductor are provided on two sides of the gate conductor.

10. The power semiconductor module of claim 1,
wherein the second power electrode of each semiconductor chip comprises a metallic buffer plate bonded to the semiconductor chip; and
wherein the leadframe is laser-welded to the buffer plate of each semiconductor chip.

11. The power semiconductor module of claim 1, wherein the leadframe provides a power terminal of the power semiconductor module, the power terminal protruding from a housing of the power semiconductor module.

12. The power semiconductor module of claim 11,
wherein a control terminal protrudes from the housing at the same level as the leadframe, the control terminal being made of the same material and with the same thickness as the leadframe; and
wherein the control terminal is electrically interconnected with the control conductor inside the housing.

13. The power semiconductor module of claim 1, wherein the semiconductor chips are arranged in at least one row; and
wherein the leadframe comprises a central part running along the row and branching parts that extend from the central part over the semiconductor chips of the row.

14. The power semiconductor module of claim 13, wherein the branching pails are bent towards the semiconductor chips.

15. A power semiconductor module, comprising:
a substrate with a structured metallization layer;
a first group of semiconductor chips, each chip of the first group having a first power electrode bonded to the metallization layer in parallel with the other chips of the first group;
a second group of semiconductor chips, each chip of the second group having a first power electrode bonded to the metallization layer in parallel with the other chips of the second group;
a first leadframe laser-welded to second power electrodes of the semiconductor chips of the first group of the semiconductor chips;
a second leadframe laser-welded to second power electrodes of the semiconductor chips of the second group of the semiconductor chips;
a first control conductor electrically connected to control electrodes of the semiconductor chips in the first group and electrically isolated from the first and second leadframes; and
a second control conductor electrically connected to control electrodes of the semiconductor chips in the second group and electrically isolated from the first and second leadframes, wherein the first control conductor is laser-welded to the control electrode of at least one semiconductor chip of the first group or the second control conductor is laser-welded to the control electrode of at least one semiconductor chip of the second group.

16. The power semiconductor module of claim 15, wherein the power semiconductor module forms a half-bridge and the first group of semiconductor chips form a low-side switch and the second group of semiconductor switches form a high-side switch.

17. The power semiconductor module of claim 15,
wherein the semiconductor chips of the first group are arranged along a center line of the power semiconductor module;
wherein the semiconductor chips of the second group are arranged in two rows outside of the first group at two sides of the first group; and
wherein the first leadframe is arranged between the substrate of the power semiconductor module and the second leadframe.

18. The power semiconductor module of claim 17, wherein the semiconductor chips of the first group are arranged in two rows along the center line of the power semiconductor module.

19. The power semiconductor module of claim 15, wherein the first control conductor is laser-welded to the control electrode of the at least one semiconductor chip of the first group and the second control conductor is laser-welded to the control electrode of the at least one semiconductor chip of the second group.

20. A power semiconductor module, comprising:
a substrate with a structured metallization layer;
a plurality of semiconductor chips arranged in first and second rows, each chip comprising a first power electrode bonded to the metallization layer;
a leadframe comprising a central part running parallel to the first and second rows and branching parts, each branching part extending from the central part toward a respective semiconductor of the first or second row, wherein a second power electrode of each semiconductor chip is laser-welded to the respective branching part; and a control conductor attached to a surface of the leadframe opposite the semiconductor chips and electrically isolated from the leadframe, wherein the control conductor is electrically connected to control electrodes of the semiconductor chips, the control conductor being laser-welded to the control electrodes.

21. The power semiconductor module of claim 20, wherein the branching parts are bent towards the semiconductor chips.

22. The power semiconductor module of claim 20, further comprising:

a second plurality of semiconductor chips arranged in third and fourth rows, the first and second rows being between the third and fourth rows, wherein each chip comprises a first power electrode bonded to the metallization layer; and a second leadframe overlying the first lead frame and comprising a central part running parallel to the third and fourth rows and branching parts, each branching part extending from the central part toward a respective semiconductor of the third or fourth row, wherein a second power electrode of each semiconductor chip is laser-welded to the respective branching part.

* * * * *

UNITED STATES PATENT AND TRADEMARK OFFICE
CERTIFICATE OF CORRECTION

PATENT NO. : 11,749,633 B2
APPLICATION NO. : 17/604717
DATED : September 5, 2023
INVENTOR(S) : Niko Pavlicek It is certified that error appears in the above-identified patent and that said Letters Patent is hereby corrected as shown below:

In the Claims

Claim 14, Column 12, Line 5; delete "pails" and insert --parts--

Signed and Sealed this
Seventh Day of November, 2023

Katherine Kelly Vidal
*Director of the United States Patent and Trademark Office*